(12) United States Patent
Kojima

(10) Patent No.: US 8,766,310 B2
(45) Date of Patent: Jul. 1, 2014

(54) SEMICONDUCTOR LIGHT EMITTING DEVICE AND METHOD FOR MANUFACTURING SAME

(75) Inventor: Akihiro Kojima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 12/849,098

(22) Filed: Aug. 3, 2010

(65) Prior Publication Data

US 2011/0220931 A1 Sep. 15, 2011

(30) Foreign Application Priority Data

Mar. 9, 2010 (JP) .................................. 2010-051506

(51) Int. Cl.
*H01L 33/00* (2010.01)

(52) U.S. Cl.
USPC .. 257/99; 257/79; 257/E33.062; 257/E33.065

(58) Field of Classification Search
USPC .................. 257/79, 95, 98, 99, 100, E33.062, 257/E33.065
See application file for complete search history.

(56) References Cited

U.S. PATENT DOCUMENTS

| 6,331,450 | B1 * | 12/2001 | Uemura | 438/114 |
|---|---|---|---|---|
| 7,019,330 | B2 * | 3/2006 | Ludowise | 257/79 |
| 8,324,632 | B2 * | 12/2012 | Nagai | 257/79 |
| 2002/0024053 | A1 * | 2/2002 | Inoue et al. | 257/79 |
| 2002/0139987 | A1 * | 10/2002 | Collins et al. | 257/88 |
| 2005/0194605 | A1 | 9/2005 | Shelton et al. | |
| 2006/0011935 | A1 * | 1/2006 | Krames et al. | 257/99 |
| 2007/0114557 | A1 | 5/2007 | Shelton et al. | |
| 2007/0170415 | A1 | 7/2007 | Maruta | |
| 2007/0278513 | A1 * | 12/2007 | Chikugawa | 257/100 |
| 2008/0191215 | A1 | 8/2008 | Choi et al. | |
| 2008/0230791 | A1 | 9/2008 | Lin et al. | |
| 2008/0252212 | A1 * | 10/2008 | Suehiro et al. | 313/512 |
| 2009/0057699 | A1 * | 3/2009 | Basin et al. | 257/98 |
| 2009/0121241 | A1 * | 5/2009 | Keller et al. | 257/96 |
| 2009/0200568 | A1 * | 8/2009 | Horie | 257/98 |

(Continued)

FOREIGN PATENT DOCUMENTS

| EP | 1460694 | 9/2004 |
|---|---|---|
| JP | 60201382 | 10/1985 |

(Continued)

OTHER PUBLICATIONS

European Search Report for 10173219.6 Mailed Nov. 25, 2010.

(Continued)

*Primary Examiner* — Eduardo A Rodela
(74) *Attorney, Agent, or Firm* — White & Case LLP

(57) ABSTRACT

According to one embodiment, a semiconductor light emitting device includes, a first semiconductor layer, a second semiconductor layer, a first electrode, a second electrode, a first interconnection, and a second interconnection. The first semiconductor layer has a first major surface, a second major surface provided on an opposite side to the first major surface, a protrusion selectively provided on the second major surface, and a trench formed from the second major surface to the first major surface. The second semiconductor layer is stacked on the protrusion of the first semiconductor layer and includes a light emitting layer. The first electrode is provided on the second major surface of the first semiconductor layer and a side surface of the trench. The second electrode is provided on a surface of the second semiconductor layer on an opposite side to the first semiconductor layer.

13 Claims, 12 Drawing Sheets

(56) References Cited

U.S. PATENT DOCUMENTS

| | | | |
|---|---|---|---|
| 2009/0272994 A1* | 11/2009 | Lim | 257/97 |
| 2010/0019254 A1* | 1/2010 | Nagai et al. | 257/88 |
| 2010/0148198 A1 | 6/2010 | Sugizaki et al. | |
| 2011/0114978 A1* | 5/2011 | Kojima et al. | 257/98 |
| 2011/0114986 A1* | 5/2011 | Kojima et al. | 257/99 |
| 2011/0204396 A1 | 8/2011 | Akimoto et al. | |
| 2011/0220910 A1 | 9/2011 | Kojima et al. | |
| 2011/0233585 A1* | 9/2011 | Kojima et al. | 257/98 |

FOREIGN PATENT DOCUMENTS

| | | |
|---|---|---|
| JP | 08-330631 | 12/1996 |
| JP | 2002-118293 | 4/2002 |
| JP | 2002-353503 | 12/2002 |
| JP | 2003-282957 A | 10/2003 |
| JP | 2005-158788 | 6/2005 |
| JP | 2006005046 | 1/2006 |
| JP | 2007-184316 | 7/2007 |
| JP | 2009-532895 | 9/2009 |
| JP | 2009-231820 | 10/2009 |
| TW | 200826322 | 6/2008 |
| WO | 02056386 | 7/2002 |
| WO | 2008026902 | 3/2008 |
| WO | 2008131743 | 11/2008 |
| WO | 2009/064330 A2 | 5/2009 |

OTHER PUBLICATIONS

Japanese Office Action for Japanese Application No. 2010-051506 mailed on May 17, 2012.
European Examination Report for European Patent Application No. 10173219.6 dated Jun. 5, 2012.
Japanese Office Action for Japanese Application No. 2010-051506 issued on Sep. 10, 2012.
Taiwanese Office Action for Application No. 099130200 Dated Mar. 14, 2013, 18 pgs.
Japanese Office Action issued on Aug. 27, 2013 in the counterpart Japanese patent application No. 2013-017020, along with an English translation thereof.
European Office Action issued on Jul. 10, 2013 in the counterpart European patent application No. 10 173 219.6.
Taiwanese Office Action issued on Jun. 24, 2013 in the counterpart Taiwanese patent application No. 099130200, along with an English translation thereof.

* cited by examiner

SEMICONDUCTOR LIGHT EMITTING DEVICE AND METHOD FOR MANUFACTURING SAME

CROSS-REFERENCE TO RELATED APPLICATION

This application is based upon and claims the benefit of priority from Japanese Patent Application No. 2010-051506, filed on Mar. 9, 2010; the entire contents of which are incorporated herein by reference.

BACKGROUND

A structure in which the p-type contact layer and the light emitting semiconductor layer are partly etched away to expose the n-type contact layer so that the exposed region of the n-type contact layer is adjacent to the stacked region of the light emitting semiconductor layer, is disclosed. An n-type electrode is formed on the exposed region of the n-type contact layer, and a p-type electrode is formed on the p-type contact layer. This structure can be used as a light emitting element of the flip chip (face down) type in which both the n-type and p-type electrode are bonded to a substrate.

DETAILED DESCRIPTION

According to one embodiment, a semiconductor light emitting device includes, a first semiconductor layer, a second semiconductor layer, a first electrode, a second electrode, a first interconnection, and a second interconnection. The first semiconductor layer has a first major surface, a second major surface provided on an opposite side to the first major surface, a protrusion selectively provided on the second major surface, and a trench formed from the second major surface to the first major surface. The second semiconductor layer is stacked on the protrusion of the first semiconductor layer and includes a light emitting layer. The first electrode is provided on the second major surface of the first semiconductor layer and a side surface of the trench. The second electrode is provided on a surface of the second semiconductor layer on an opposite side to the first semiconductor layer. The first interconnection is provided on a surface of the first electrode on an opposite side to the second major surface. The second interconnection is provided on a surface of the second electrode on an opposite side to the second semiconductor layer.

Embodiments will now be described with reference to the drawings.

Figure 1:
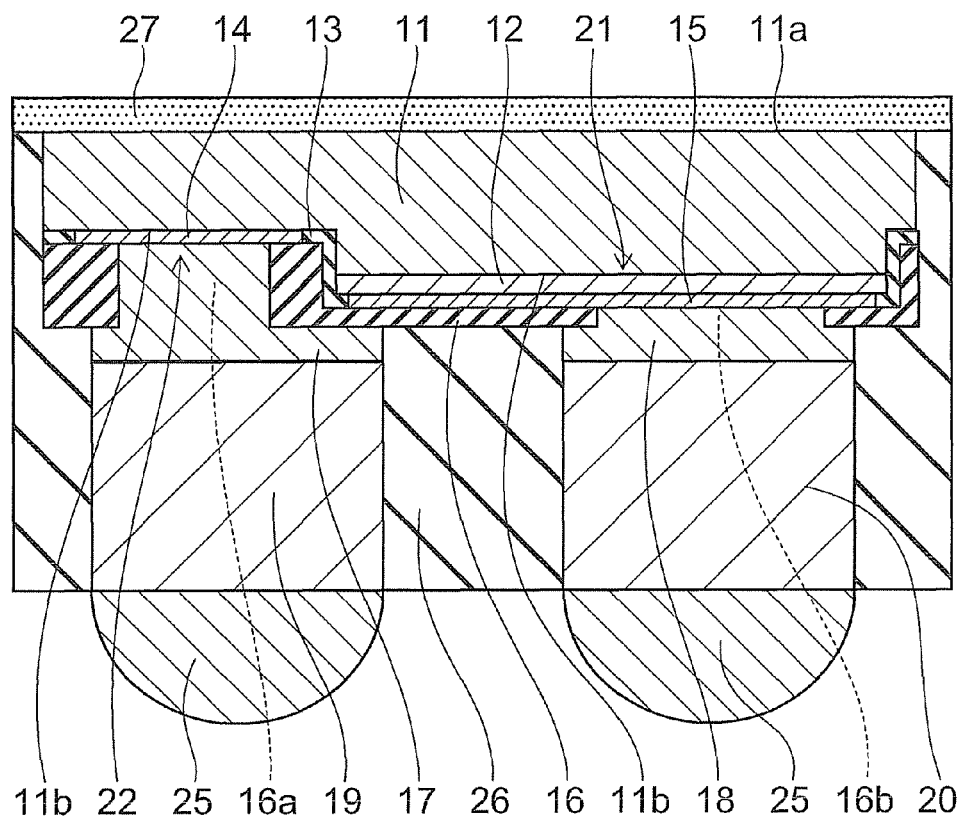
FIG. 1 is a schematic cross-sectional view of the semiconductor light emitting device of an embodiment corresponding to A-A cross-section in FIG. 4A.

FIG. 1 is a schematic cross-sectional view of a semiconductor light emitting device of this embodiment.

The semiconductor light emitting device of this embodiment includes a stacked body of semiconductor layers, a package structure section including interconnections and sealing resin, and a phosphor layer, which are formed collectively in a wafer state. The stacked body of semiconductor layers includes a first semiconductor layer 11 and a second semiconductor layer 12. The first semiconductor layer 11 is illustratively an n-type GaN layer and functions as a lateral current path. However, the conductivity type of the first semiconductor layer 11 is not limited to n-type, but may be p-type.

Light is extracted to the outside mainly from the first major surface 11a of the first semiconductor layer 11. The second semiconductor layer 12 is provided on the second major surface 11b of the first semiconductor layer 11 on the opposite side to the first major surface 11a.

Figure 2:
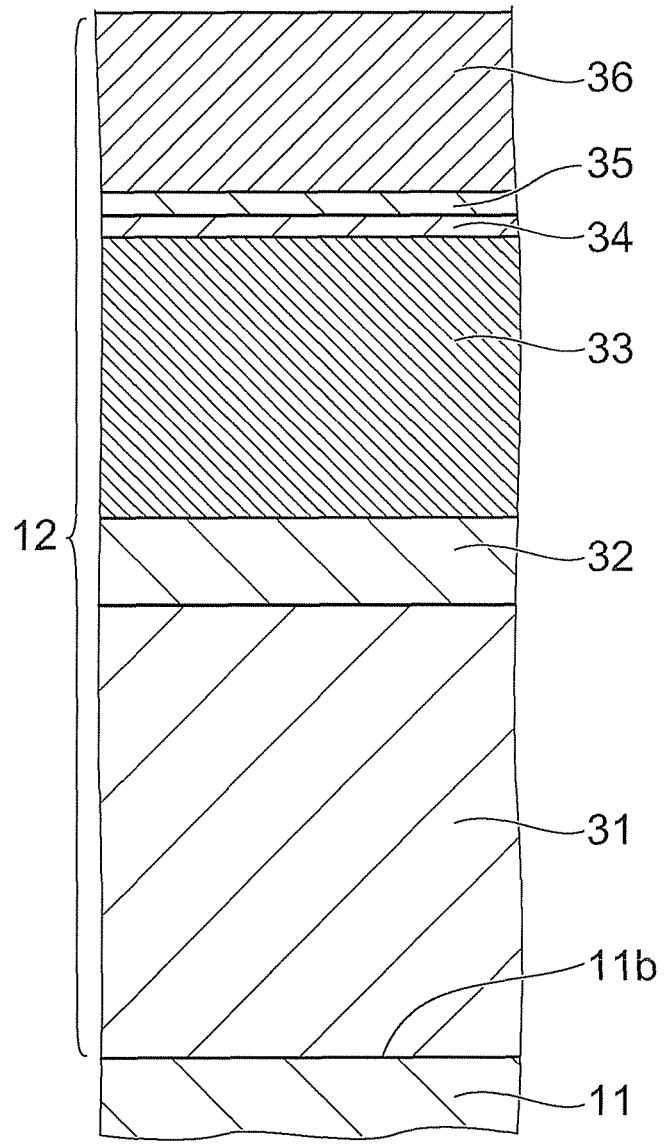
FIG. 2 is an enlarged cross-sectional view of a neighborhood of the light emitting layer in the semiconductor layer shown in FIG. 1.

The second semiconductor layer 12 has a stacked structure of a plurality of semiconductor layers including a light emitting layer (active layer). FIG. 2 shows an example of this structure.

An n-type GaN layer 31 is provided on the second major surface 11b of the first semiconductor layer 11. An n-type InGaN layer 32 is provided on the GaN layer 31. A light emitting layer 33 is provided on the InGaN layer 32. The light emitting layer 33 illustratively has a multiple quantum well structure including InGaN. A p-type GaN layer 34 is provided on the light emitting layer 33. A p-type AlGaN layer 35 is provided on the GaN layer 34. A p-type GaN layer 36 is provided on the AlGaN layer 35.

A protrusion 21 and a depression 22 are provided on the second major surface 11b side of the first semiconductor layer 11. The second semiconductor layer 12 is provided on the surface of the protrusion 21. Hence, the protrusion 21 includes the stacked structure of the first semiconductor layer 11 and the second semiconductor layer 12.

The bottom surface of the depression 22 is the second major surface 11b of the first semiconductor layer 11, and an n-side electrode 14 is provided as a first electrode on the second major surface 11b of the depression 22.

A p-side electrode 15 is provided as a second electrode on the opposite surface of the second semiconductor layer 12 of the protrusion 21 with respect to the surface in contact with the first semiconductor layer 11.

The second major surface 11b of the first semiconductor layer 11 is covered with an insulating film 13 such as silicon oxide film. The n-side electrode 14 and the p-side electrode 15 are exposed from the insulating film 13. The n-side electrode 14 and the p-side electrode 15 are insulated by the insulating film 13 and serve as electrodes electrically independent of each other. Furthermore, the insulating film 13 also covers the side surface of the protrusion 21 including the light emitting layer.

An insulating film 16 is provided on the second major surface 11b side so as to cover the insulating film 13, the n-side electrode 14, and the p-side electrode 15. The insulating film 16 is illustratively made of silicon oxide film or resin.

The surface of the insulating film 16 on the opposite side to the first semiconductor layer 11 and the second semiconductor layer 12 is planarized, and an n-side interconnection 17 as a first interconnection and a p-side interconnection 18 as a second interconnection are provided on that surface.

The n-side interconnection 17 is provided also in the opening 16a formed in the insulating film 16 and reaching the n-side electrode 14, and is electrically connected to the n-side electrode 14. The p-side interconnection 18 is provided also in the opening 16b formed in the insulating film 16 and reaching the p-side electrode 15, and is electrically connected to the p-side electrode 15.

For instance, the n-side interconnection 17 and the p-side interconnection 18 are simultaneously formed by a plating process. In the plating, process a seed metal formed on the surface of the insulating film 16 including the inner wall surface of the openings 16a, 16b, is used as a current path.

The n-side electrode 14, the p-side electrode 15, the n-side interconnection 17, and the p-side interconnection 18 are all provided on the second major surface 11b side of the first semiconductor layer 11, and constitute a interconnection layer for supplying a current to the light emitting layer.

An n-side metal pillar 19 is provided as a first metal pillar on the surface of the n-side interconnection 17 on the opposite side to the n-side electrode 14. A p-side metal pillar 20 is provided as a second metal pillar on the surface of the p-side interconnection 18 on the opposite side to the p-side electrode 15. The periphery of the n-side metal pillar 19, the periphery of the p-side metal pillar 20, the n-side interconnection 17, and the p-side interconnection 18 are covered with a resin 26.

The first semiconductor layer 11 is electrically connected to the n-side metal pillar 19 through the n-side electrode 14 and the n-side interconnection 17. The second semiconductor layer 12 is electrically connected to the p-side metal pillar 20 through the p-side electrode 15 and the p-side interconnection 18. External terminals 25 such as solder balls and metal bumps are provided on the lower end surface of the n-side metal pillar 19 and the p-side metal pillar 20 exposed from the resin 26. The semiconductor light emitting device can be electrically connected to external circuits through the external terminals 25.

In the structure of this embodiment, even if the stacked body of the first semiconductor layer 11 and the second semiconductor layer 12 is thin, its mechanical strength can be maintained by thickening the n-side metal pillar 19, the p-side metal pillar 20, and the resin 26. Furthermore, the n-side metal pillar 19 and the p-side metal pillar 20 can absorb and relax the stress applied to the semiconductor layer through the external terminals 25 when the device is mounted on a circuit board or the like. Preferably, the resin 26 serving to reinforce the n-side metal pillar 19 and the p-side metal pillar 20 has a thermal expansion coefficient which is equal or close to that of the circuit board and the like. Examples of such a resin 26 include epoxy resin, silicone resin, and fluororesin.

The n-side interconnection 17, the p-side interconnection 18, the n-side metal pillar 19, and the p-side metal pillar 20 can be made of such a material as copper, gold, nickel, and silver. Among them, it is more preferable to use copper, which has good thermal conductivity, high migration resistance, and superior contact with insulating films.

The phosphor layer 27 is provided on the first major surface 11a of the first semiconductor layer 11. The phosphor layer 27 is provided with a generally uniform thickness in the plane direction of the first major surface 11a. Light emitted from the light emitting layer passes mainly in the first semiconductor layer 11, the first major surface 11a and the phosphor layer 27, and is emitted to the outside.

The phosphor layer 27 can absorb the light from the light emitting layer and emit wavelength-converted light. Thus, it is possible to emit mixed light of the light from the light emitting layer and the wavelength-converted light of the phosphor layer 27. For instance, for a nitride-based light emitting layer, a white light, a lamp light and the like can be obtained as a mixed light of blue light from the light emitting layer and yellow light, for instance, which is the wavelength-converted light of a yellow phosphor layer 27.

Figure 3:
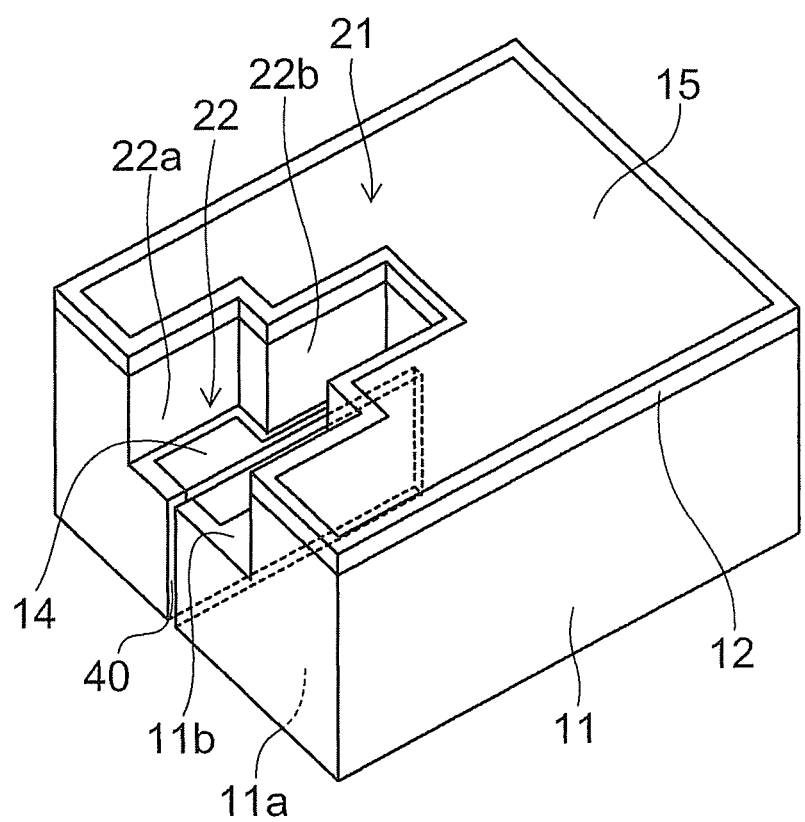
FIG. 3 is a schematic perspective view of a relevant part of the semiconductor light emitting device of this embodiment.

FIG. 3 is a schematic perspective view of major components in the semiconductor light emitting device described above.

Figure 4A:
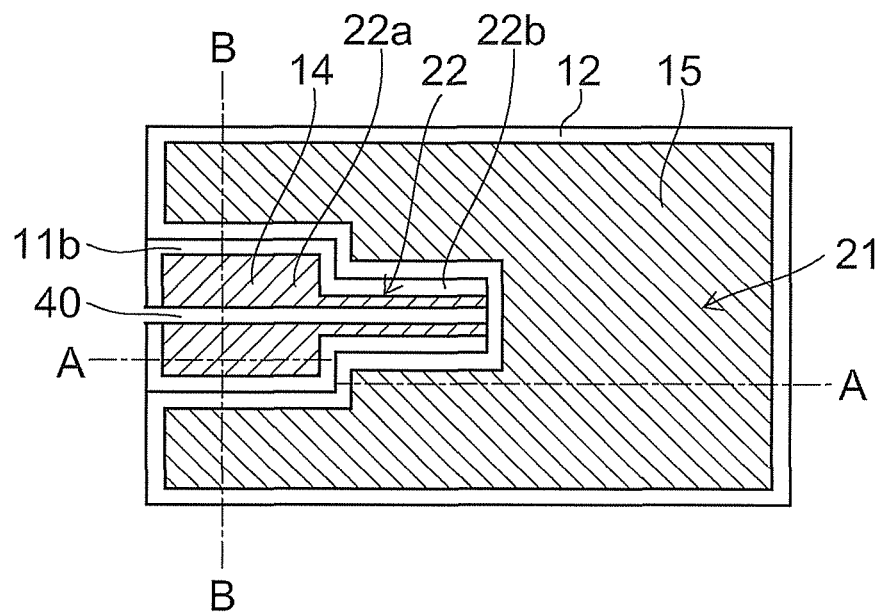
FIGS. 4A and 4B are schematic plan views of a relevant part of the semiconductor light emitting device of this embodiment.

FIG. 4A is a plan view corresponding to FIG. 3.

Figure 4B:
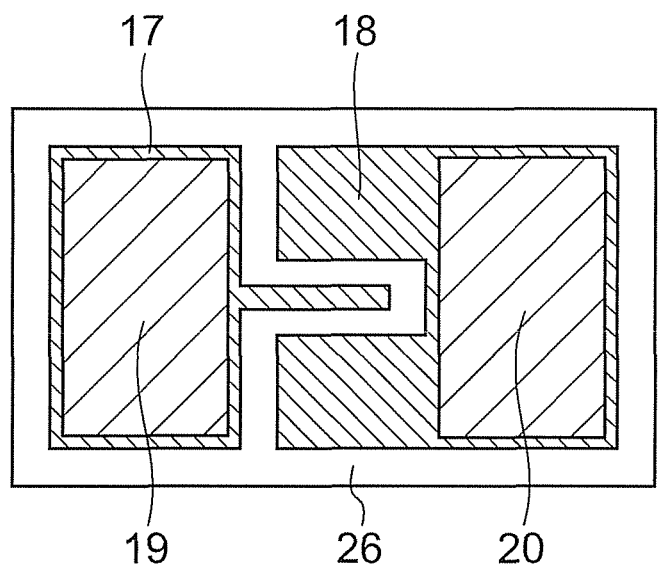

FIG. 4B is a plan view showing an example planar layout of the n-side interconnection 17, the p-side interconnection 18, the n-side metal pillar 19, and the p-side metal pillar 20.

FIG. 1 corresponds to the A-A cross section in FIG. 4A. Furthermore, FIG. 8B corresponds to the B-B cross section in FIG. 4A. However, FIG. 8B shows the state before removal of the substrate 10.

The depression 22 includes a first depression 22a with a relatively wide width, and a second depression 22b with a relatively narrow width. The first depression 22a and the second depression 22b have an equal depth. The protrusion 21 including the second semiconductor layer 12 surrounds the depression 22. The second major surface 11b of the first semiconductor layer 11 exposed by removal of part of the second semiconductor layer 12 and the first semiconductor layer 11 constitutes the bottom surface of the depression 22.

In the second major surface 11b in the depression 22, a trench 40 extending from the second major surface 11b to the first major surface 11a is formed. That is, the trench 40 pierces the first semiconductor layer 11 below the depression 22. For instance, the trench 40 extends in a straight line across the first depression 22a and the second depression 22b. The protrusion 21 is provided on both sides of the trench 40 in a width direction and on one longitudinal end side of the trench 40. For processing reasons, the trench 40 is not formed below the protrusion 21.

The n-side electrode 14 is formed on the second major surface 11b of the depression 22. The p-side electrode 15 is formed on the second semiconductor layer 12 of the protrusion 21. In plan view, as shown in FIG. 4A, the p-side electrode 15 surrounds the n-side electrode 14.

The n-side electrode 14 is formed like a pad on the second major surface 11b of the first depression 22a having a relatively wide width. This serves to ensure a large contact area between the n-side electrode 14 and the n-side interconnection 17 on the second major surface 11b. On the second major surface 11b of the second depression 22b, the n-side electrode 14 is formed along the longitudinal direction of the trench 40 near the opening edge of the trench 40.

Furthermore, as shown in FIG. 8B, the n-side electrode 14 is formed also inside (on the side surface and bottom of) the trench 40. The n-side electrode 14 is formed integrally and simultaneously on the second major surface 11b of the depression 22 and inside the trench 40 by an evaporation process, for instance, using a resist mask, not shown.

Because the n-side electrode 14 is formed also at the bottom of the trench 40, the phosphor layer 27 can be formed with a uniform thickness without penetrating into the trench 40 when the phosphor layer 27 is formed on the first major surface 11a after removal of the substrate 10 described later.

As shown in FIG. 8B, the insulating films 13, 16 are provided on the side surface of the protrusion 21 around the depression 22. The insulating films 13, 16 can prevent short circuit between the n-side electrode 14 and the second semiconductor layer 12 and between the n-side electrode 14 and the p-side electrode 15.

As described above, the n-side interconnection 17 is formed illustratively by a plating process. The seed metal in this process is formed also on the side surface and the bottom surface of the n-side electrode 14 in the trench 40. Hence, as shown in FIG. 8B, the n-side interconnection 17 is buried also inside the n-side electrode 14 in the trench 40. Thus, the n-side electrode 14 and the n-side interconnection 17 are in contact with each other not only on the second major surface 11b but also in the trench 40. This increases the contact area between the n-side electrode 14 and the n-side interconnection 17, and can reduce the contact resistance.

In a structure with an n-side electrode and a p-side electrode formed on one major surface side of a semiconductor layer, if the planar area of the p-side electrode is made relatively large, the light emitting area can be increased to enhance the brightness. However, if the planar area of the p-side electrode is increased without changing the chip size (planar size), the planar area of the n-side electrode is relatively decreased. The decrease of the planar area of the n-side electrode causes concern about reliability degradation due to current concentration on the n-side electrode.

However, in this embodiment, the trench 40 is formed in the region of the first semiconductor layer 11 where the n-side electrode 14 is formed, and the n-side electrode 14 is formed also on the side surface of the trench 40, that is, on the side surface of the first semiconductor layer 11. Thus, the area of the n-side electrode 14 in contact with the first semiconductor layer 11 can be increased without changing the planar area ratio between the p-side electrode 15 and the n-side electrode 14. Hence, without increasing the chip size, the area of the n-side electrode 14 can be increased to enhance the reliability, and the area reduction of the p-side electrode 15 can be suppressed to enhance the brightness.

Furthermore, in a structure with the n-side electrode 14 being in contact with the first semiconductor layer 11 at only the limited planar surface, the electric field distribution in the first semiconductor layer 11 concentrates on the front surface side, which makes it difficult to control the light emission efficiency and chromatic uniformity. This increases the load on the design of the phosphor layer and the lens, which forces the chip size to increase and results in cost increase, causing difficulty in compatibility with the performance.

In contrast, in this embodiment, the n-side electrode 14 is in contact not only with the front surface of the first semiconductor layer 11, but also with the side surface of the first semiconductor layer 11. This increases the contact area between the first semiconductor layer 11 and the n-side electrode 14, which suppresses the concentration of electric field distribution in the first semiconductor layer 11 and facilitates characteristics control. Consequently, the load on the design of the phosphor layer and the lens is reduced, which leads to downsizing and cost reduction.

Here, in the case where the processing of the trench 40 is stopped halfway through the first semiconductor layer 11, depth variation is likely to occur in the process. The depth variation of the trench 40 leads to variation in the contact area between the n-side electrode 14 and the first semiconductor layer 11 constituting the side surface of the trench 40. This translates into variation in the contact resistance therebetween, and may lead to characteristics variation.

In contrast, in this embodiment, the trench 40 is formed from the second major surface 11b of the first semiconductor layer 11 so as to reach the first major surface 11a on the opposite side thereof. Specifically, as described later, the substrate 10 below the first major surface 11a serves as a stopper in processing the trench 40 so that the trench 40 can be obtained with a constant depth. This serves to prevent characteristics variation due to variation in the contact area between the n-side electrode 14 and the first semiconductor layer 11 via the side surface of the trench 40.

Next, a method for manufacturing a semiconductor light emitting device of this embodiment is described with reference to FIGS. 5A to 9B.

Figure 5A:
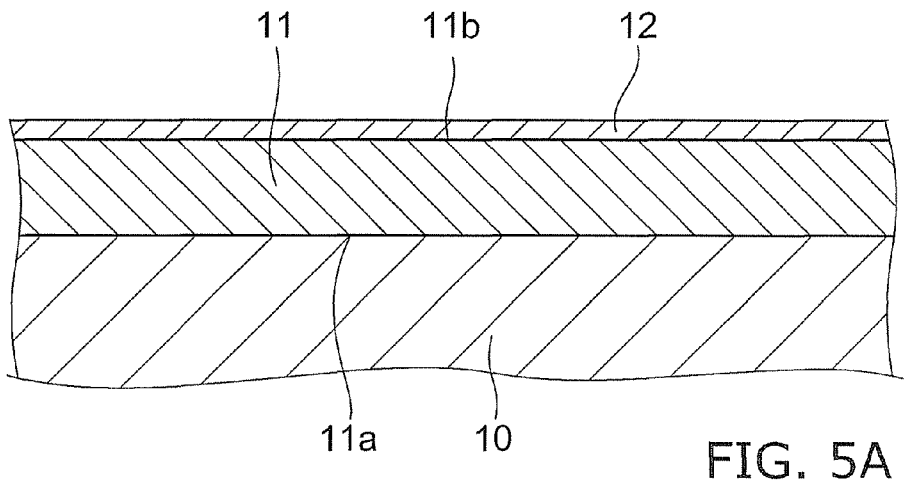
FIGS. 5A to 5C show a method for manufacturing the semiconductor light emitting device of this embodiment, and are schematic cross-sectional views corresponding to A-A cross section in FIG, 4A.
Figure 5B:
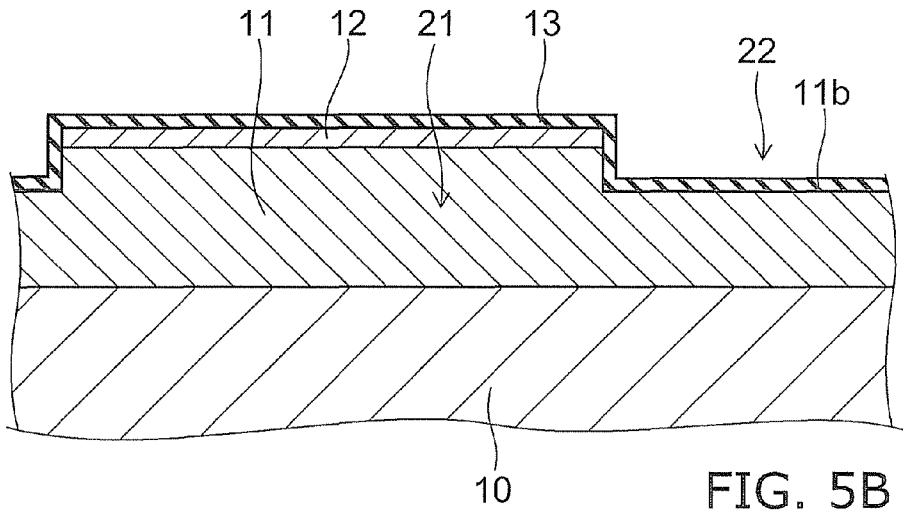
Figure 5C:
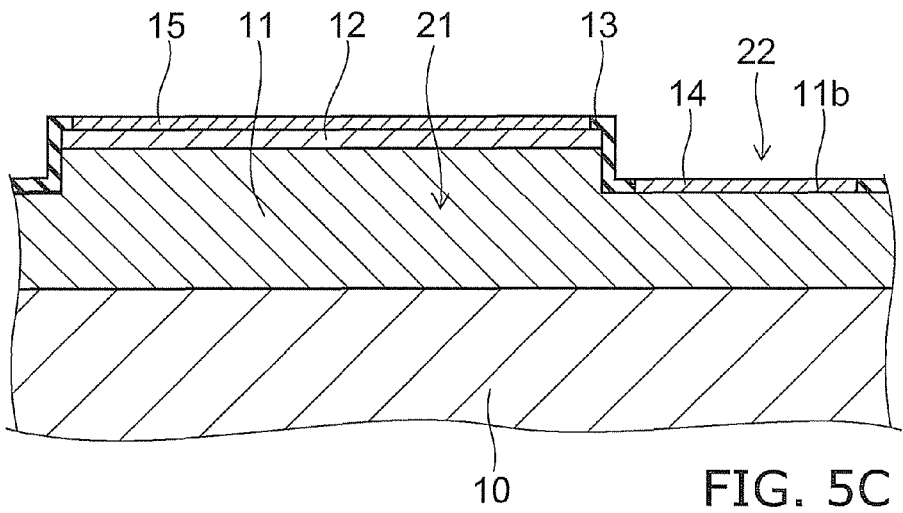

FIGS. 5A to 5C correspond to the A-A cross section in FIG. 4A. FIGS. 6A to 8B correspond to the B-B cross section in FIG. 4A.

First, as shown in FIG. 5A, a first semiconductor layer 11 is formed on the major surface of a substrate 10. The surface of the first semiconductor layer 11 on the substrate 10 side corresponds to the first major surface 11a. A second semiconductor layer 12 is formed on the second major surface 11b of the substrate 10 on the opposite side to the first major surface 11a. For instance, in the case where the light emitting layer is made of a nitride semiconductor, the stacked body of the first semiconductor layer 11 and the second semiconductor layer 12 can be grown as a crystal on a sapphire substrate.

Figure 6A:
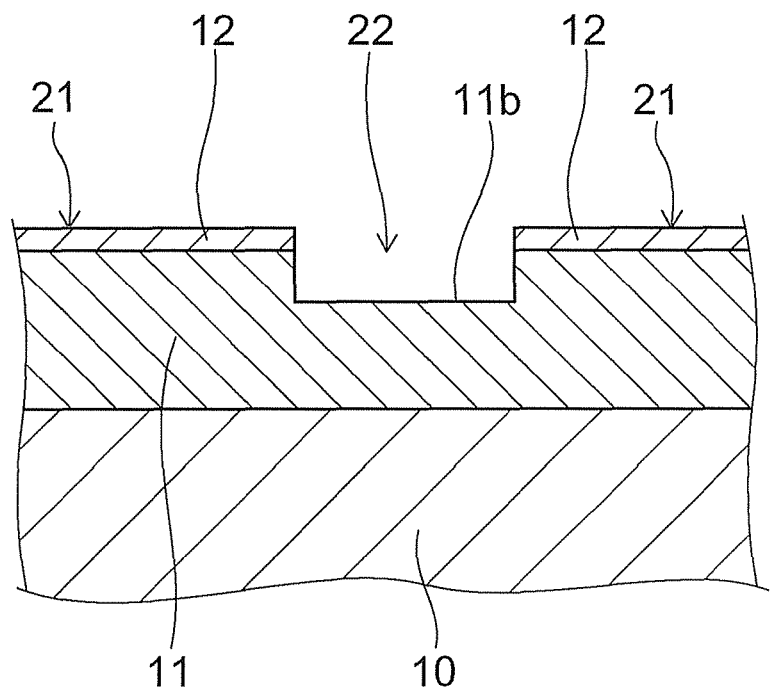
FIG. 6A to FIG. 8B show the method for manufacturing the semiconductor light emitting device of this embodiment, and are schematic cross-sectional views corresponding to B-B cross section in FIG, 4A.

Next, for instance, an RIE (reactive ion etching) process using a resist, not shown, is used to selectively remove part of the second semiconductor layer 12 and the first semiconductor layer 11. As shown in FIGS. 5B and 6A, the portion from which the part of the second semiconductor layer 12 and the first semiconductor layer 11 are removed constitutes a depression 22, and the portion where the second semiconductor layer 12 including the light emitting layer is left constitutes a protrusion 21. The second major surface 11b of the first semiconductor layer 11 is exposed to the bottom of the depression 22.

Figure 9A:
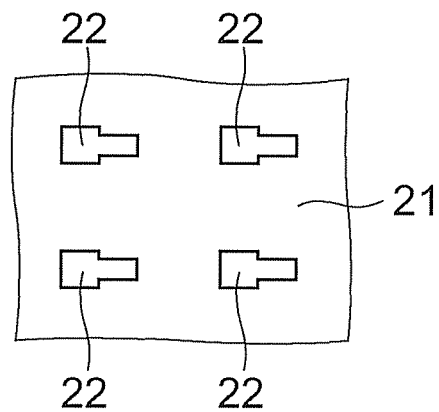
FIGS. 9A and 9B are schematic plan views showing the method for manufacturing the semiconductor light emitting device of this embodiment.

The substrate 10 and the stacked body of the first semiconductor layer 11 and the second semiconductor layer 12 are in a wafer state, and a plurality of depressions 22 are formed as shown in FIG. 9A, which shows part of the wafer in plan view.

Figure 6B:
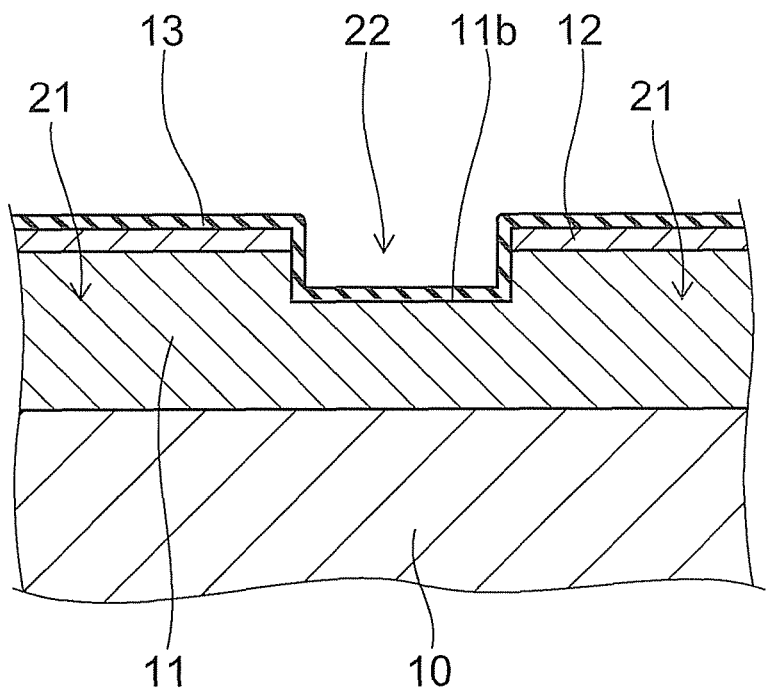

Next, as shown in FIGS. 5B and 6B, the entire wafer surface including the step portion between the protrusion 21 and the depression 22 is covered with an insulating film 13. The insulating film 13 is formed illustratively by a CVD (chemical vapor deposition) process. After the insulating film 13 is formed, the second semiconductor layer 12 is activated by heat treatment.

Figure 7A:
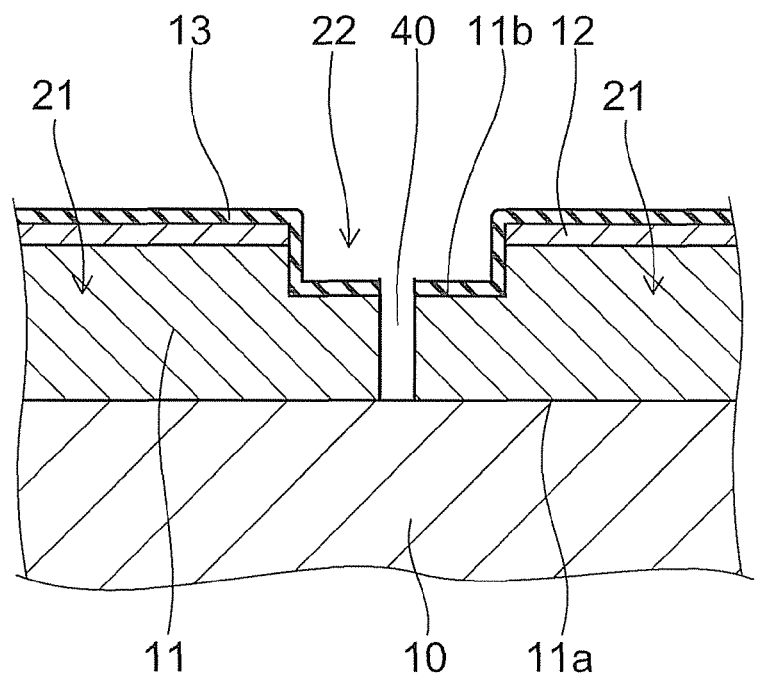
Figure 9B:
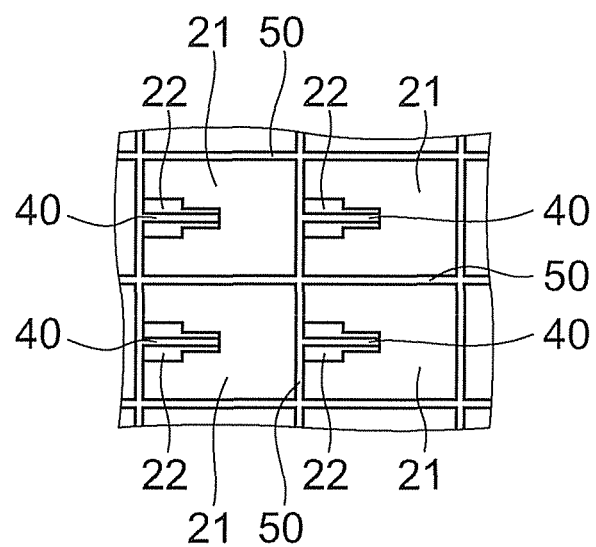

Next, as shown in FIGS. 7A and 9B, a trench 40 extending from the second major surface 11b at the bottom of the depression 22 to the substrate 10 is formed. Furthermore, as shown in FIG. 9B, a dicing trench 50 is formed. The trench 40 and the dicing trench 50 are simultaneously formed by an RIE process, for instance, using a resist, not shown.

The dicing trench 50 pierces the second semiconductor layer 12 and the first semiconductor layer 11 to the substrate 10. Alternatively, at the time of forming the depression 22 described above, a depression is formed also at the position for forming the dicing trench 50, and the dicing trench 50 is formed from the bottom surface of the depression to reach the substrate 10.

The dicing trench 50 separates the first semiconductor layer 11 into a plurality on the substrate 10. The dicing trench 50 is formed illustratively like a lattice in the wafer surface. This results in a plurality of chip regions surrounded by the dicing trench 50. Here, the planar shape of the individual chip region may be rectangular or square. Increase in the number of processes is avoided by forming the trench 40 simultaneously with forming the dicing trench 50.

Figure 7B:
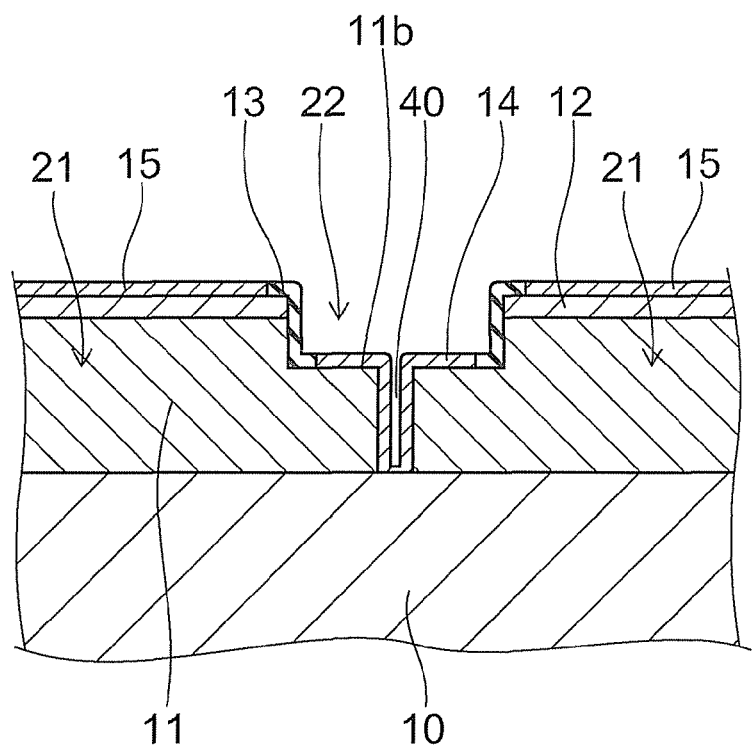

Next, openings are selectively formed in the insulating film 13, and as shown in FIGS. 5C and 7B, a p-side electrode 15 is formed on the second semiconductor layer 12 of the protrusion 21, and an n-side electrode 14 is formed on the second major surface 11b of the first semiconductor layer 11 in the depression 22. Furthermore, as shown in FIG. 7B, the n-side electrode 14 is formed also inside (on the side surface and bottom of) the trench 40. The n-side electrode 14 is formed integrally in the same process on the second major surface 11b of the depression 22 and inside the trench 40.

Figure 8A:
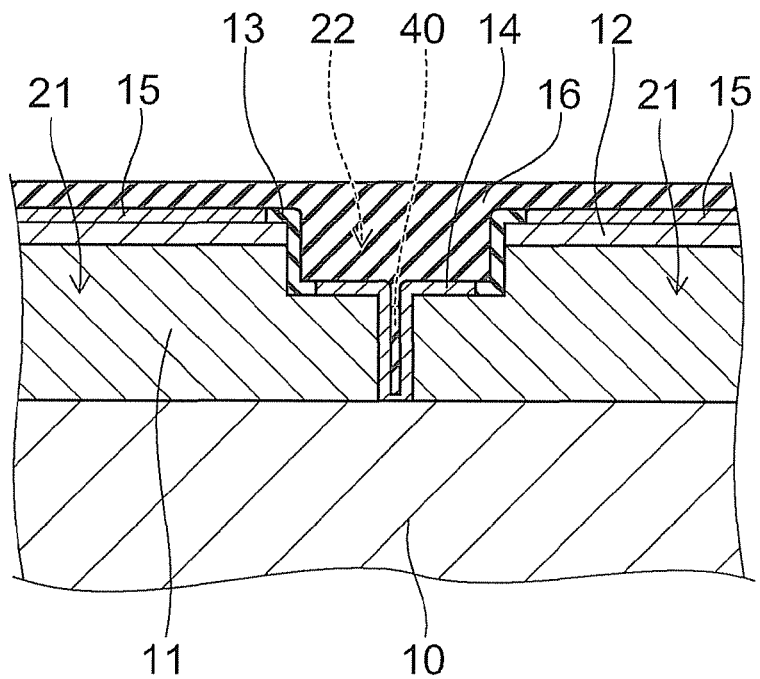
Figure 8B:
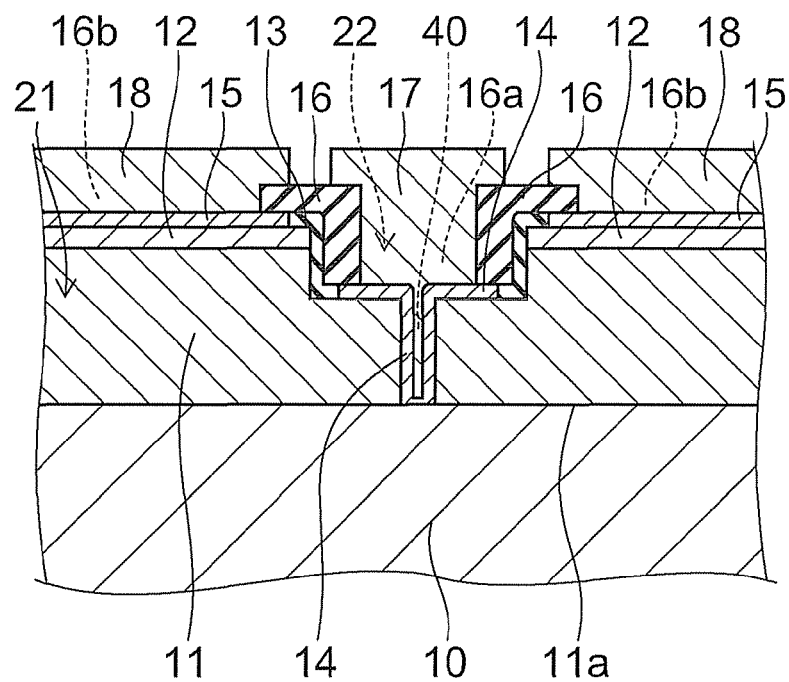

Next, as shown in FIGS. 1 and 8A, an insulating film 16 covering the n-side electrode 14, the p-side electrode 15, and the insulating film 13 is formed. As shown in FIG. 8A, the insulating film 16 is buried also inside the n-side electrode 14 in the trench 40. After the insulating film 16 is formed, an opening 16a reaching the n-side electrode 14 and an opening 16b reaching the p-side electrode 15 are formed in the insulating film 16 illustratively by using a hydrofluoric acid solution. Furthermore, the insulating film 16 in the trench 40 is also removed.

Next, a seed metal (Cu), not shown, is formed on the upper surface of the insulating film 16, the inner wall (side surface and bottom surface) of the openings 16a, 16b, and the inner surface of the n-side electrode 14 in the trench 40, and a plating resist, not shown, is further formed. Then, Cu plating is performed using the seed metal as a current path.

Thus, as shown in FIGS. 1 and 8B, an n-side interconnection 17 and a p-side interconnection 18 are selectively formed on the upper surface (the surface on the opposite side to the first semiconductor layer 11 and the second semiconductor layer 12) of the insulating film 16. The p-side interconnection 18 is formed also in the opening 16b and connected to the p-side electrode 15.

The n-side interconnection 17 is formed also in the opening 16a and connected to the n-side electrode 14. Furthermore, the n-side interconnection 17 is formed also in the trench 40 and connected also to the n-side electrode 14 in the trench 40. The n-side electrode 14 and the n-side interconnection 17 are buried in the trench 40, achieving the reduction of resistance between the n-side interconnection 17 and the side surface of the first semiconductor layer 11, which is the side surface of the trench 40.

Next, the plating resist used for the plating of the n-side interconnection 17 and the p-side interconnection 18 is removed with chemicals. Then, another plating resist for forming metal pillars is formed, and electrolytic plating is performed using the aforementioned seed metal as a current path. Thus, as shown in FIG. 1, an n-side metal pillar 19 is formed on the n-side interconnection 17, and a p-side metal pillar 20 is formed on the p-side interconnection 18.

Subsequently, the plating resist for forming metal pillars is removed with chemicals, and furthermore the exposed portion of the seed metal is removed. This breaks the electrical connection between the n-side interconnection 17 and the p-side interconnection 18 through the seed metal.

Next, as shown in FIG. 1, the n-side interconnection 17, the p-side interconnection 18, the n-side metal pillar 19, the p-side metal pillar 20, and the insulating film 16 are covered with a resin 26. Furthermore, at this time, part of the resin 26 is buried in the aforementioned dicing trench 50.

Subsequently, the surface of the resin 26 is ground to expose the end surface of the n-side metal pillar 19 and the p-side metal pillar 20. Then, external terminals 25 such as solder balls and metal bumps are provided on the exposed surface.

Next, the substrate 10 is removed. The substrate 10 is removed from the first semiconductor layer 11 illustratively by a laser lift-off process. Specifically, laser light is applied toward the first semiconductor layer 11 from the back surface side of the substrate 10, which is the surface opposite to its major surface on which the first semiconductor layer 11 is formed. The laser light has a wavelength to which the substrate 10 is transmissive and which falls in an absorption region of the first semiconductor layer 11.

When the laser light reaches the interface between the substrate 10 and the first semiconductor layer 11, the first semiconductor layer 11 near the interface is decomposed by absorbing the energy of the laser light. For instance, in the case where the first semiconductor layer 11 is made of GaN, it is decomposed into Ga and nitrogen gas. This decomposition reaction forms a small gap between the substrate 10 and the first semiconductor layer 11, and separates the substrate 10 from the first semiconductor layer 11. Irradiation with laser light is performed a plurality of times on predefined regions throughout the wafer to remove the substrate 10.

After the substrate 10 is removed, as shown in FIG. 1, a phosphor layer 27 is formed on the first major surface 11a of the first semiconductor layer 11. For instance, the phosphor layer 27 is formed by applying a liquid resin mixed with phosphor particles by a spin coating process, and then heat-curing it.

Here, as shown in FIG. 8B, because the opening of the trench 40 on the first major surface 11a side is occluded, the phosphor layer 27 does not penetrate into the trench 40. Furthermore, because the resin 26 is buried in the dicing trench 50, the phosphor layer 27 does not penetrate also into the dicing trench 50. Consequently, the phosphor layer 27 can be formed with a uniform thickness, and variation in chromatic characteristics can be suppressed.

Because the phosphor layer 27 is formed after the substrate 10 is removed from above the first major surface 11a, the substrate 10 does not exist between the first major surface 11a serving as a light extraction surface and the phosphor layer 27, which serves to increase the light extraction efficiency.

Subsequently, by cutting along the dicing trench 50, a singulated semiconductor light emitting device is obtained. Because the substrate 10 has already been removed and furthermore the resin 26 is buried in the dicing trench 50, dicing can be easily performed, and the productivity can be improved. Furthermore, because the first semiconductor layer 11 and the second semiconductor layer 12 do not exist in the dicing trench 50, damage to these semiconductor layers at the time of dicing can be avoided. By cutting along the dicing trench 50 filled with the resin 26, as shown in FIG. 1, the end surface of the first semiconductor layer 11 in the singulated device is covered with the resin 26.

Singulation is performed by cutting around at least one chip region of a plurality of chip regions surrounded by the dicing trench 50 as shown in FIG. 9B. That is, singulation may be performed by cutting at the dicing trench 50 surrounding a plurality of chip regions.

The aforementioned processes prior to dicing are each performed collectively in a wafer state, which eliminates the need of interconnection and packaging for each singulated device, enabling significant reduction of production cost. That is, interconnection and packaging have already been finished in the singulated device. Furthermore, it is easy to achieve downsizing in which the planar size of the individual device is close to the planar size of the bare chip (the stacked body of the first semiconductor layer 11 and the second semiconductor layer 12).

Figure 10A:
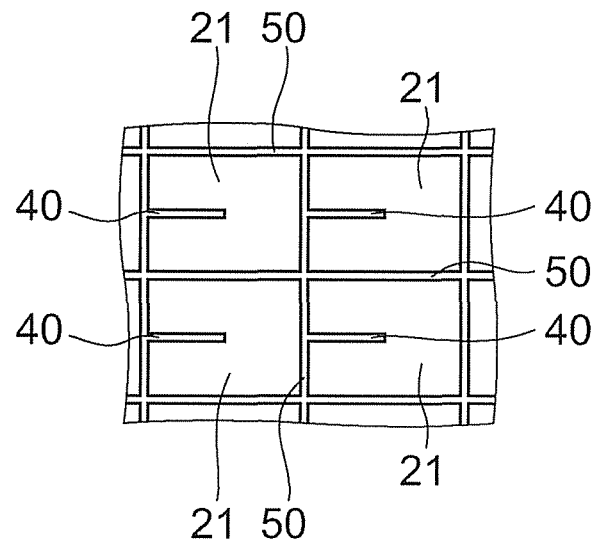
FIGS. 10A and 10B are schematic plan views showing another method for manufacturing the semiconductor light emitting device of this embodiment.

The formation of the trench 40 and the dicing trench 50, both reaching the substrate 10, may be performed before the process for forming the depression 22. That is, as shown in FIG. 5A, after the first semiconductor layer 11 and the second semiconductor layer 12 are sequentially formed on the substrate 10, the trench 40 and the dicing trench 50 are formed as shown in FIG. 10A. The trench 40 and the dicing trench 50 are simultaneously formed by an RIE process using a resist, for instance, and pierce the second semiconductor layer 12 and the first semiconductor layer 11 to the substrate 10.

Figure 10B:
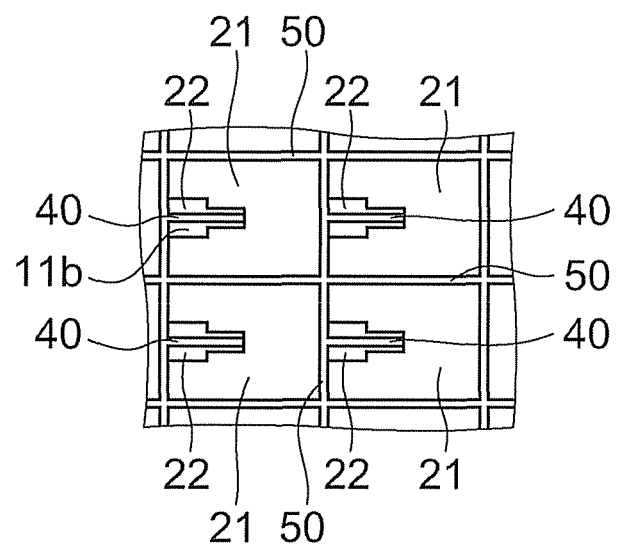

Subsequently, part of the second semiconductor layer 12 and the first semiconductor layer 11 around the trench 40 are selectively removed to form a depression 22 where the second major surface 11$b$ of the first semiconductor layer 11 is exposed around the trench 40 as shown in FIG. 10B. At this time, the portion to constitute a protrusion 21, the trench 40, and the dicing trench 50 are covered with the resist and not etched.

Figure 11:
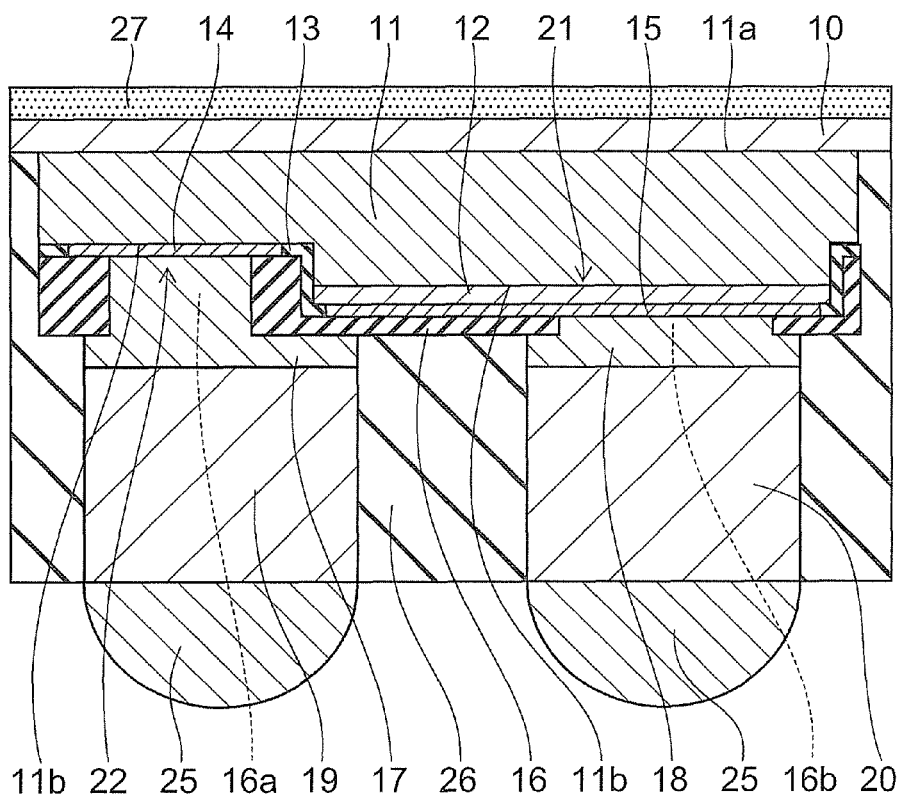
FIG. 11 is a schematic cross-sectional view showing a specific example having the substrate left with respect to the structure in FIG. 1.

Here, the substrate 10 may not be completely removed, but may be thinly ground and left on the first major surface 11$a$ of the first semiconductor layer 11 as shown in FIG. 11. The phosphor layer 27 is provided on the substrate 10 and opposed to the first major surface 11$a$ across the substrate 10.

By thinning and leaving the substrate 10, it is possible to achieve higher mechanical strength, and hence a more reliable structure, than the structure in which the substrate 10 is completely removed. Furthermore, the remaining substrate 10 can suppress warpage after singulation, and facilitates mounting on a circuit board and the like.

Figure 12A:
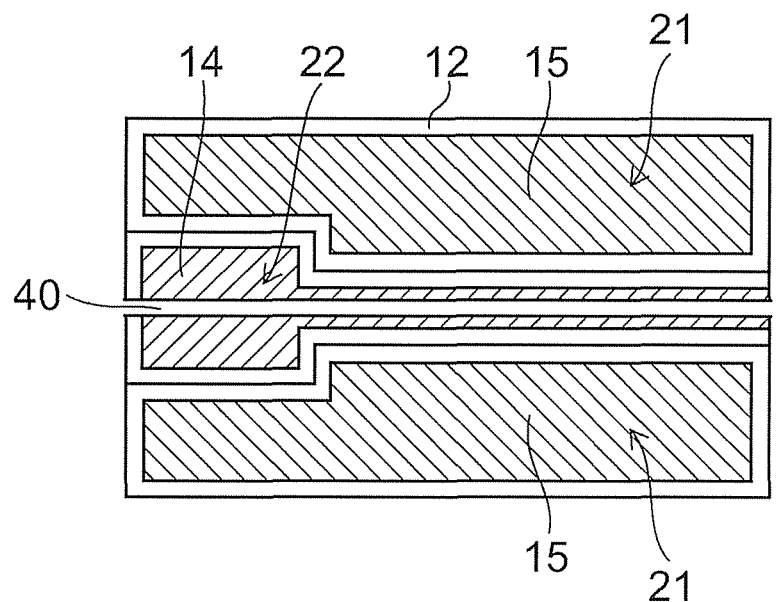
FIGS. 12A and 12B are schematic plan views of a relevant part of another specific example of the semiconductor light emitting device of this embodiment.

In one chip region, the protrusion 21 may be divided by the depression 22 and the trench 40 as shown in FIG. 12A. Even if the p-side electrode 15 is divided, the p-side interconnection 18 and the p-side metal pillar 20 can be provided on each divided portion of the p-side electrode 15.

Figure 12B:
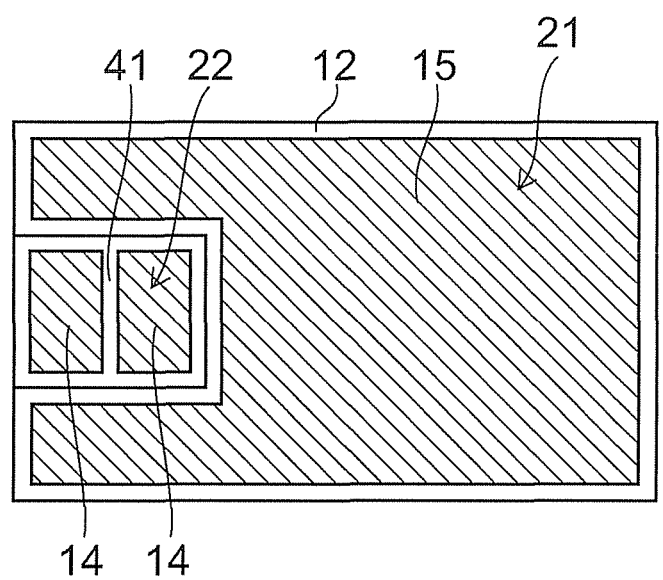

FIG. 12B shows another example planar layout of the trench 41, the n-side electrode 14, and the p-side electrode 15. The trench 41 in this example extends in the B-B direction in FIG. 4A. This trench 41 also extends from the bottom surface (second major surface 11$b$) of the depression 22 to the first major surface 11$a$ on the opposite side, and the n-side electrode 14 is formed on the side surface of the trench 41. Here, a plurality of crossing trenches extending in a plurality of directions may be formed. Furthermore, although FIG. 4A illustrates a layout in which part of the depression 22 and the n-side electrode 14 extends into the protrusion 21 side, the planar layout of the depression 22 may be rectangular or square as shown in FIG. 12B.

The embodiments have been described with reference to examples. However, the embodiments are not limited thereto, but can be variously modified within the spirit of the invention. The material, size, shape, layout and the like of the substrate, semiconductor layer, electrode, interconnection, metal pillar, insulating film, and resin can be variously modified by those skilled in the art, and such modifications are also encompassed within the scope of the invention as long as they do not depart from the spirit of the invention.

Examples of the phosphor include red phosphor, yellow phosphor, green phosphor, and blue phosphor.

For instance, the red phosphor can include nitride phosphor, $CaAlSiN_3$:Eu, and SiAlON phosphor.

It is preferable to use the red SiAlON phosphor indicated by the following composition formula (1).

$$(M_{1-x}R_x)_{a1}AlSi_{b1}O_{c1}N_{d1} \qquad (1)$$

M is at least one metal element except for Si and Al. Preferably, M is any of Ca and Sr at least. R is luminescence center atom. Preferably, R is Eu.

x, a1, b1, c1 and d1 satisfy the following relation.

0<x≤1, 0.6<a1<0.95, 2<b1<3.9, 0.25<c1<0.45, 4<d1<5.7

The red SiAlON phosphor indicated by the formula (1) improves temperature property of wavelength conversion efficiency. Furthermore, the red SiAION phosphor much improves efficiency at large current density range.

For instance, the yellow phosphor can include silicate phosphor, and $(Sr, Ca, Ba)_2SiO_4$:Eu. For instance, the green phosphor can include halogen phosphate phosphor, $(Ba, Ca, Mg)_{10}(PO_4)_6.Cl_2$:Eu, and SiAlON phosphor.

It is preferable to use the green SiAlON phosphor indicated by the following composition formula (2).

$$(M_{1-x}R_x)_{a2}AlSi_{b2}O_{c2}N_{d2} \qquad (2)$$

M is at least one metal element except for Si and Al.

Preferably, M is any of Ca and Sr at least. R is luminescence center atom. Preferably, R is Eu.

x, a2, b2, c2 and d2 satisfy the following relation.

0<x≤1, 0.93<a2<1.3, 4.0<b2<5.8, 0.6<c2<1, 6<d2<11

The green SiAlON phosphor indicated by the formula (2) improves temperature property of wavelength conversion efficiency. Furthermore, the green SiAlON phosphor much improves efficiency at large current density range.

For instance, the blue phosphor can include oxide phosphor, and $BaMgAl_{10}O_{17}$:Eu.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor light emitting device comprising:
   a semiconductor layer having a first major surface, a second major surface provided on an opposite side to the first major surface, a protrusion including a light emitting layer and a depression provided on the second major surface, and a trench that extends from a bottom surface of the depression to the first major surface;
   a first electrode provided on the bottom surface of the depression of the semiconductor layer and a side surface of the trench;
   a second electrode provided on a surface of the protrusion of the semiconductor layer;
   a first interconnection provided on a surface of the first electrode, the first interconnection buried inside the first electrode in the trench; and
   a second interconnection provided on a surface of the second electrode.

2. The device of claim 1, wherein the first electrode is provided also at a bottom of the trench.

3. The device of claim 1, wherein the protrusion is provided on both sides of the trench in a width direction.

4. The device of claim 1, further comprising:
   an insulating film provided on a side surface of the protrusion around the first electrode.

5. The device of claim 1, further comprising:
   a first metal pillar provided on a surface of the first interconnection on an opposite side to the first electrode; and a second metal pillar provided on a surface of the second interconnection on an opposite side to the second electrode.

6. The device of claim 5, further comprising:
a resin covering a periphery of each of the first metal pillar and the second metal pillar.

7. The device of claim 1, further comprising:
a phosphor layer opposed to the first major surface of the first semiconductor layer.

8. The device of claim 1, wherein the semiconductor layer is formed on a substrate and removed from the substrate.

9. A semiconductor light emitting device comprising:
a semiconductor layer having a first major surface, a second major surface provided on an opposite side to the first major surface, a protrusion including a light emitting layer and a depression provided on the second major surface, and a trench that extends from a bottom surface of the depression to the first major surface, the trench dividing a portion of the semiconductor layer to have two side surfaces facing each other, the trench provided in the depression extending in a straight line, the trench not provided in the protrusion;
a first electrode provided on the bottom surface of the depression and the two side surfaces of the trench;
a second electrode provided on a surface of the protrusion of the semiconductor layer;
a first interconnection provided on a surface of the first electrode; and
a second interconnection provided on a surface of the second electrode.

10. The device of claim 8, wherein the semiconductor layer is grown as a crystal on the substrate and removed from the substrate.

11. A semiconductor light emitting device comprising:
a semiconductor layer having a first major surface, a second major surface provided on an opposite side to the first major surface, a protrusion including a light emitting layer and a depression provided on the second major surface, and a trench that extends from a bottom surface of the depression to the first major surface;
a first electrode provided on the bottom surface of the depression of the semiconductor layer and a side surface of the trench;
a second electrode provided on a surface of the protrusion of the semiconductor layer;
a first interconnection provided on a surface of the first electrode;
a second interconnection provided on a surface of the second electrode; and
a phosphor layer provided on the first major surface side of the semiconductor layer without a substrate between the first major surface and the phosphor layer.

12. The device of claim 1, wherein the first electrode is in contact with the side surface of the trench.

13. The device of claim 1, wherein the semiconductor layer had been formed on a substrate.

* * * * *